United States Patent
Hu

(10) Patent No.: US 7,795,957 B1
(45) Date of Patent: Sep. 14, 2010

(54) POWER SUPPLY CIRCUIT FOR SOUTH BRIDGE CHIP

(75) Inventor: Ke-You Hu, Shenzhen (CN)

(73) Assignees: Hong Fu Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/557,534

(22) Filed: Sep. 11, 2009

(30) Foreign Application Priority Data

Jun. 25, 2009 (CN) .................. 2009 1 0303688

(51) Int. Cl.
*H03K 5/00* (2006.01)
(52) U.S. Cl. ...................................... 327/558; 327/552
(58) Field of Classification Search ......... 327/551–559, 327/336, 344
See application file for complete search history.

(56) References Cited

U.S. PATENT DOCUMENTS 7,408,816 B2 * 8/2008 Jiang et al. ............. 365/189.09
2005/0015635 A1 * 1/2005 Juan ........................... 713/323

* cited by examiner

*Primary Examiner*—Dinh T. Le
(74) *Attorney, Agent, or Firm*—Frank R. Niranjan

(57) ABSTRACT

A power supply circuit for a south bridge chip includes a voltage conversion chip having a first voltage input terminal, a second voltage input terminal, a driving voltage output terminal, and a gate voltage output terminal, a control circuit having a first control terminal, a second control terminal, and an output terminal, and a filter circuit coupled between the control circuit and the south bridge chip. The voltage conversion chip receives a first voltage and a second voltage from a power supply at the first and second voltage input terminals respectively, and outputs driving voltages at the driving voltage output terminal and gate voltage output terminal respectively. The control circuit receives the driving voltages at the first and second control terminals respectively, and outputs a working voltage to the south bridge chip via the filter circuit.

7 Claims, 2 Drawing Sheets

POWER SUPPLY CIRCUIT FOR SOUTH BRIDGE CHIP

BACKGROUND

1. Technical Field

The present disclosure relates to power supply circuits.

2. Description of Related Art

With the rapid development of personal computers, more functionality are being added and more add-on cards or peripheral devices are attached to the motherboard and this have brought about a corresponding increase in power usage. Therefore, wasting of power becomes more likely if the computer is not changed to a power saving state when not in use. Typically, a wake up circuit is provided when designing computer power management for solving the above problem. There is usually a sleep/wake button on the keyboard of the computer that is connected to the inner wake up circuit of the motherboard of the computer. The button is pressed by a user for putting the computer to sleep. Then when the user wishes, presses the same button again to activate or wake up the computer.

Typically, the south bridge chip is used for waking up the computer. A power supply circuit is used for providing power to the south bridge chip. However, the typical power supply circuit has a low response speed, and generates large amounts of ripple voltage, which commonly causes the wake up circuit to fail.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
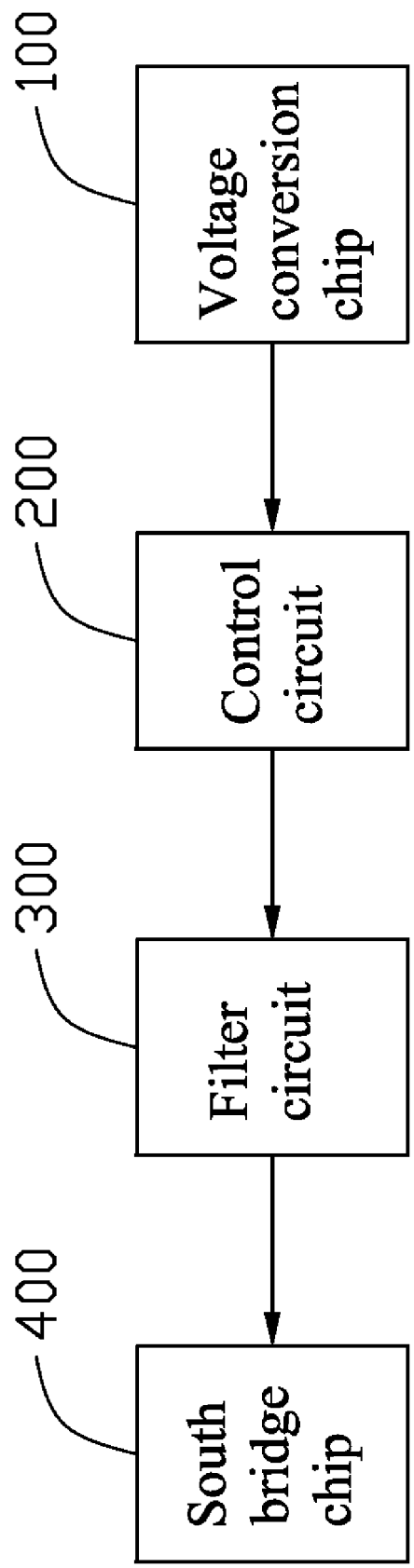
FIG. 1 is a block diagram of a power supply circuit for a south bridge chip, in accordance with an embodiment.
Figure 2:
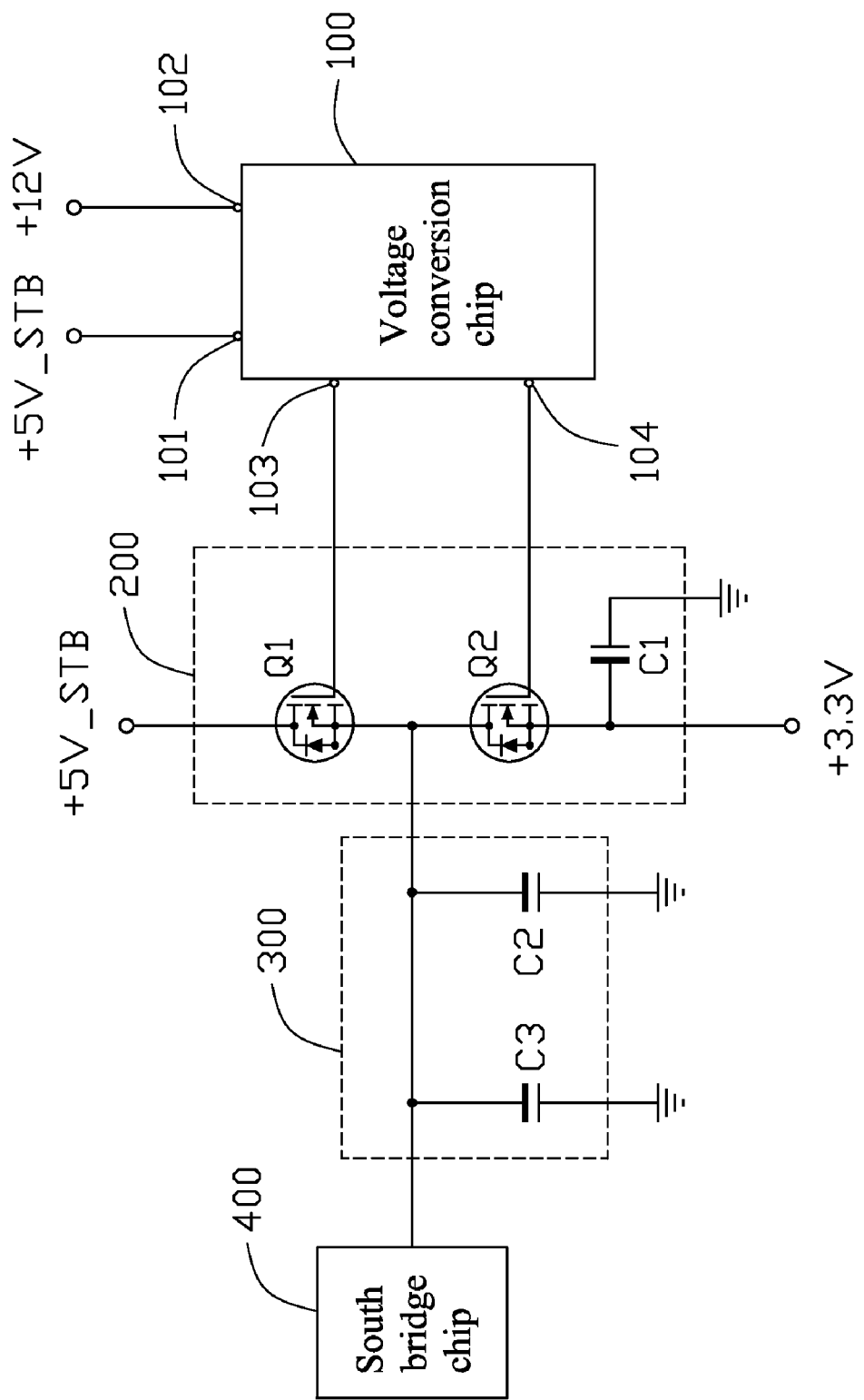
FIG. 2 is a circuit diagram of the power supply circuit for the south bridge chip of FIG. 1.

Referring to FIGS. 1 and 2, a power supply circuit for a south bridge chip 400 includes a voltage conversion chip 100, a control circuit 200, a filter circuit 300. The voltage conversion chip 100 includes a first voltage input terminal 101, a second voltage input terminal 102, a driving voltage output terminal 103, and a gate voltage output terminal 104. The control circuit 200 has a first control terminal, a second control terminal, and an output terminal. The voltage conversion chip 100 receives a +5 volts standby voltage and a +12 volts voltage from a power supply (not shown) at the first and second voltage input terminals 101, 102 respectively, and outputs driving voltages at the driving voltage output terminal 103 and gate voltage output terminal 104 respectively. The control circuit 200 receives the driving voltages at the first and second control terminals respectively, and outputs a working voltage to the south bridge chip 400 via the filter circuit 300.

The control circuit 200 includes MOSFETs Q1, Q2, and a capacitor C1. The MOSFETs Q1, Q2 gates are electrically coupled to the driving voltage output terminal 103 and gate voltage output terminal 104 via the first and second control terminals respectively. The MOSFET Q1 source and the MOSFET Q2 drain are electrically coupled to the filter circuit 300 input terminal via the control circuit 200 output terminal. The MOSFET Q1 drain is configured for receiving the +5 volts standby voltage. The MOSFET Q2 source is configured for receiving a +3.3 volts voltage from the power supply (not shown), and is electrically coupled to the capacitor C1 first terminal. The capacitor C1 second terminal is grounded. In this embodiment, the MOSFETs Q1, Q2 are N-channel MOSFETs. A capacitance value of the capacitor C1 is 470 µF.

The filter circuit 300 includes capacitors C2, C3. The capacitors C2, C3 first terminals are electrically coupled to the control circuit 200 output terminal via the filter circuit 300 input terminal, and are electrically coupled to the south bridge chip 400 via the filter circuit 300 output terminal. The capacitors C2, C3 second terminals are grounded. In this embodiment, a capacitance value of the capacitor C2 is 1000 µF, and a capacitance value of the capacitor C3 is 470 µF.

In use, the voltage conversion chip 100 outputs a +3 volts driving voltage at the driving voltage output terminal 103 and gate voltage output terminal 104 respectively. The MOSFETs Q1, Q2 turn on, the +5 volts standby voltage at the MOSFET Q1 drain is pulled down by the +3.3 volts voltage at the MOSFET Q2 source, and then the control circuit 200 output terminal outputs the +3.3 volts voltage, which is provided to the south bridge chip 400 via the filter circuit 300. The MOSFETs Q1, Q2 have a high response speed, and the filter circuit 300 filters the ripples from the voltage supplied to the south bridge chip 400. Thereby, circuit failure is avoided.

Using an oscillograph to test the working voltage signal of the power supply circuit for a south bridge chip, the test result shows that the +3.3 volts is normally output without delay when the power supply circuit for the south bridge chip of the disclosure is used, and pulled down to +2.52 volts with 2.94 millisecond delay when using a common power supply circuit.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A power supply circuit for south bridge chip, comprising:
    a voltage conversion chip having a first voltage input terminal, a second voltage input terminal, a driving voltage output terminal, and a gate voltage output terminal;
    a control circuit having a first control terminal electrically coupled to the driving voltage output terminal, a second control terminal electrically coupled to the gate voltage output terminal, and an output terminal; and
    a filter circuit coupled between the control circuit and the south bridge chip;
    wherein the voltage conversion chip receives a first voltage and a second voltage from a power supply at the first and second voltage input terminals respectively, and outputs driving voltages at the driving voltage output terminal and gate voltage output terminal respectively, the control circuit receives the driving voltages at the first and second control terminals respectively, and outputs a working voltage to the south bridge chip via the filter circuit.

2. The power supply circuit for south bridge chip of claim 1, wherein when the control circuit first and second control terminals receive a high voltage level of the driving voltages, the control circuit turns on to output the working voltage.

3. The power supply circuit for south bridge chip of claim 2, wherein the control circuit comprises a first MOSFET, and a second MOSFET, the first and second MOSFETs gates are configured for receiving the driving voltages via the first and second control terminals respectively, the first MOSFET source and the second MOSFET drain are electrically coupled to the filter circuit input terminal via the control circuit output terminal, the first MOSFET drain is configured for receiving the first voltage, the second MOSFET source is configured for receiving a third voltage, and is electrically coupled to a first capacitor first terminal, the first capacitor second terminal is grounded.

4. The power supply circuit for south bridge chip of claim 3, wherein the first and second MOSFETs are N-channel MOSFET.

5. The power supply circuit for south bridge chip of claim 3, wherein the filter circuit comprises a second capacitor, and a third capacitor, the second and third capacitors first terminals are electrically coupled to the control circuit output terminal via the filter circuit input terminal, and are electrically coupled to the south bridge chip via the filter circuit output terminal, the second and third capacitors second terminals are grounded.

6. The power supply circuit for south bridge chip of claim 3, wherein the first voltage is a +5 volts standby voltage, the second voltage is 12 volts, the working voltage and third voltage are +3.3 volts.

7. The power supply circuit for south bridge chip of claim 5, wherein a capacitance value of the first capacitor is 470 μF, a capacitance value of the second capacitor is 1000 μF, a capacitance value of the third capacitor is 470 μF.

* * * * *

UNITED STATES PATENT AND TRADEMARK OFFICE
CERTIFICATE OF CORRECTION

| | | |
|---|---|---|
| PATENT NO. | : 7,795,957 B1 | Page 1 of 1 |
| APPLICATION NO. | : 12/557534 | |
| DATED | : September 14, 2010 | |
| INVENTOR(S) | : Ke-You Hu | |

It is certified that error appears in the above-identified patent and that said Letters Patent is hereby corrected as shown below:

Please replace Section (73) regarding "Assignees" on the Title page of the Patent with the following:

(73) Assignees: Hong Fu Jin Precision Industry (ShenZhen) Co., Ltd., Shenzhen, Guangdong Province (CN); Hon Hai Precision Industry Co. Ltd., Tu-Cheng, Taipei Hsien (TW).

Signed and Sealed this

Twenty-first Day of December, 2010

David J. Kappos
*Director of the United States Patent and Trademark Office*